United States Patent
Baba

(10) Patent No.: US 11,805,593 B2
(45) Date of Patent: Oct. 31, 2023

(54) COOLING DEVICE

(71) Applicant: DENSO CORPORATION, Kariya (JP)

(72) Inventor: Yoshirou Baba, Kariya (JP)

(73) Assignee: DENSO CORPORATION, Kariya (JP)

( * ) Notice: Subject to any disclaimer, the term of this patent is extended or adjusted under 35 U.S.C. 154(b) by 72 days.

(21) Appl. No.: 17/331,700

(22) Filed: May 27, 2021

(65) Prior Publication Data

US 2021/0378086 A1 Dec. 2, 2021

(30) Foreign Application Priority Data

Jun. 1, 2020 (JP) .................................. 2020-095728

(51) Int. Cl.
*H05K 1/02* (2006.01)
*H05K 7/20* (2006.01)

(52) U.S. Cl.
CPC ........... *H05K 1/021* (2013.01); *H05K 7/2039* (2013.01); *H05K 2201/066* (2013.01)

(58) Field of Classification Search
CPC ..... H05K 1/0201; H05K 1/0203–0204; H05K 1/021; H05K 7/20; H05K 7/2039; H05K 7/20454; H05K 7/2089; H05K 2201/066; H05K 2201/10166; H05K 2201/10674; H01L 21/56; H01L 23/12; H01L 23/3121; H01L 23/34–3731; H01L 23/3736; H01L 25/07; H01L 25/18; H01L 29/00; H01L 24/32; H01H 9/52; F28F 3/00; F28F 3/06; F28F 21/085

See application file for complete search history.

(56) References Cited

U.S. PATENT DOCUMENTS

| | | | |
|---|---|---|---|
| 2005/0150649 A1 | 7/2005 | Tsukamoto | |
| 2007/0062676 A1* | 3/2007 | Yao | ...................... H01L 23/3675 |
| | | | 361/705 |
| 2007/0246208 A1 | 10/2007 | Tsukamoto | |
| 2008/0151503 A1* | 6/2008 | Aapro | ................... H04M 1/026 |
| | | | 361/714 |
| 2008/0289810 A1 | 11/2008 | Okabayashi | |

(Continued)

FOREIGN PATENT DOCUMENTS

| | | | |
|---|---|---|---|
| EP | 3514827 A1 * | 7/2019 | |
| JP | H10-056114 A | 2/1998 | |

(Continued)

OTHER PUBLICATIONS

EP-3514827-A1 English Translation (Year: 2019).*

*Primary Examiner* — Amir A Jalali
(74) *Attorney, Agent, or Firm* — POSZ LAW GROUP, PLC

(57) ABSTRACT

A cooling device includes: an electronic component; a circuit board on which the electronic component is mounted; and a heat sink provided to dissipate heat to an outside of the cooling device. The cooling device also includes: a graphite sheet integrally provided on a surface of the heat sink on one side facing the electronic component; a heat conductive portion contacting both a part of the graphite sheet and the electronic component; and a shielding portion. The shielding portion is provided at a position between a portion of the circuit board where no electronic component is mounted and the graphite sheet to cover a shielded surface of the graphite sheet.

22 Claims, 12 Drawing Sheets

(56) References Cited

U.S. PATENT DOCUMENTS

| | | | |
|---|---|---|---|
| 2011/0247795 A1* | 10/2011 | Horng | H01L 23/373 |
| | | | 165/185 |
| 2013/0141866 A1* | 6/2013 | Refai-Ahmed | H01L 23/3672 |
| | | | 361/679.54 |
| 2013/0320517 A1* | 12/2013 | Shirley | B32B 37/12 |
| | | | 165/185 |
| 2018/0146539 A1* | 5/2018 | Zhang | H05K 9/0024 |
| 2018/0288908 A1* | 10/2018 | Lee | H05K 9/0088 |
| 2018/0374716 A1* | 12/2018 | Stathakis | H01L 21/56 |
| 2019/0006731 A1* | 1/2019 | Chiu | H01Q 21/065 |
| 2019/0043779 A1* | 2/2019 | Chung | G06F 1/203 |
| 2020/0178415 A1* | 6/2020 | Kim | H05K 7/20454 |
| 2021/0020542 A1* | 1/2021 | Kumura | H01L 23/433 |
| 2021/0029855 A1* | 1/2021 | Yoon | H01L 23/42 |
| 2021/0035881 A1* | 2/2021 | Mallik | H01L 23/3135 |
| 2021/0068244 A1* | 3/2021 | Jung | H05K 1/0231 |
| 2021/0100090 A1* | 4/2021 | Chang | H05K 1/0201 |
| 2021/0225777 A1* | 7/2021 | Bolotov | H01L 23/00 |

FOREIGN PATENT DOCUMENTS

| | | |
|---|---|---|
| JP | 2004-023066 A | 1/2004 |
| JP | 4868457 B1 | 2/2012 |
| JP | 2012-238733 A | 12/2012 |
| JP | 6086775 B1 | 3/2017 |
| JP | 2019-087609 A | 6/2019 |
| WO | 2006/134858 A1 | 12/2006 |

* cited by examiner ably broken.
COOLING DEVICE

CROSS REFERENCE TO RELATED APPLICATION

The present application is based on and claims the benefit of priority of Japanese Patent Application No. 2020-095728, filed on Jun. 1, 2020, the disclosure of which is incorporated herein by reference.

TECHNICAL FIELD

The present disclosure generally relates to a cooling device.

BACKGROUND INFORMATION

A cooling device transfers heat from heat-generating components mounted on a circuit board to a graphite sheet for heat dissipation. The graphite sheet is provided to be sandwiched between a case and the heat-generating components. The graphite sheet faces the circuit board in a portion that is not in contact with the heat-generating components. The graphite sheet is brittle in strength and easily broken. Small pieces of the graphite sheet may fall on the circuit board, which may cause a problem.

SUMMARY

It is an object of the present disclosure to provide a cooling device capable of suppressing adhesion of small pieces of graphite sheet to a circuit board.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
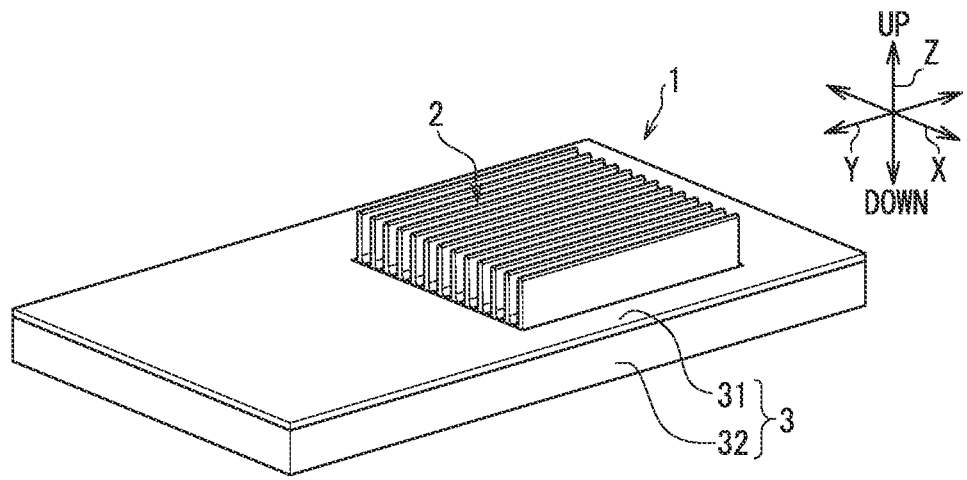
FIG. 1 is a perspective view showing a cooling device of a first embodiment.

Hereinafter, embodiments for implementing the present disclosure are described referring to drawings. In each embodiment, components/configurations corresponding to elements described in preceding embodiment(s) are denoted by the same reference numerals, and redundant explanation may be omitted. When only a part of a configuration is described in an embodiment, other preceding embodiment may be applied to the other parts of such configuration. It may be possible not only to combine components/configurations explicitly in the following embodiments, but also to partially combine the embodiments without such explicit description of combination unless otherwise indicated.

First Embodiment

The first embodiment of a cooling device that can achieve the object disclosed in the specification is described with reference to FIGS. 1 to 7. A cooling device is a device that is applied to an electrical equipment and electronic device to dissipate heat generated by components mounted on a circuit board to the outside of the equipment/device. The cooling device is particularly suitable for application to an in-vehicle electronic control device mounted on a vehicle. The vehicle is, for example, a gasoline vehicle, a diesel vehicle, a hybrid vehicle, an electric vehicle, a fuel cell vehicle, or the like. The in-vehicle electronic control device is strongly affected by the vibration of the device that generates the driving/thrusting force for a travel of the vehicle and/or the vibration caused by the travel on a road of the vehicle itself. Therefore, the cooling device is required to have durability and reliability against a vibration load. In particular, the cooling device mounted on a vehicle is required to have reliability so as not to stop the function of electric equipment and the like. The cooling device disclosed in the specification has such durability and reliability.

Figure 2:
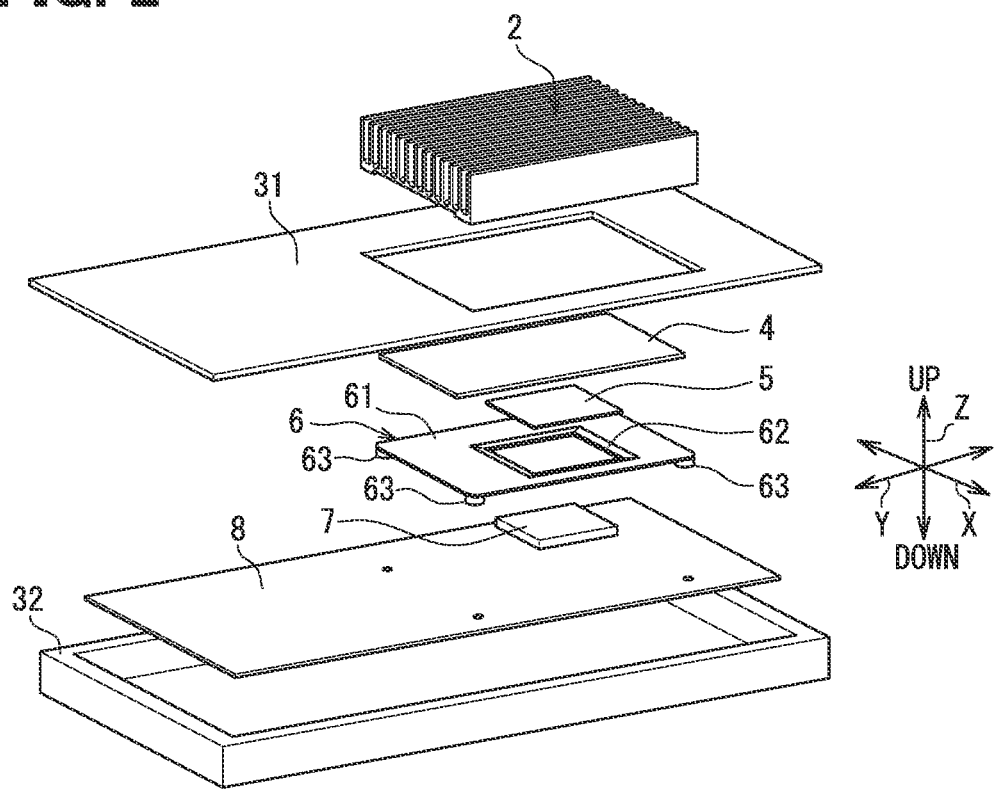
FIG. 2 is an exploded view of the cooling device.
Figure 3:
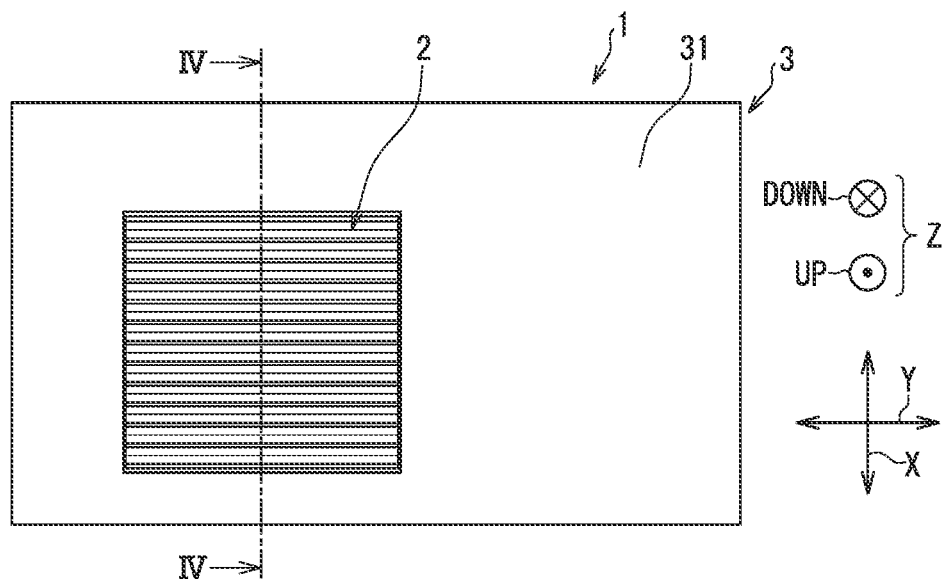
FIG. 3 is a plan view of the cooling device as viewed downward from a top.

As shown in FIGS. 1 and 2, the cooling device 1 includes a case 3, an electronic component 7, a circuit board 8, a heat conductive portion 5, a shielding portion 6, a graphite sheet 4, and a heat sink 2. The case 3 forms an outer shell of the cooling device 1. The case 3 is formed by combining a plurality of case members. The case 3 includes, for example, a first case member and a second case member. For example, the first case member is an upper case member 31 mounted on a lower case member 32 so as to cover an internal space of the lower case member 32 which is the second case member. The case 3 is made of a metal material or contains a resin material. The case 3 contains, for example, a molded product made of aluminum die-cast.

In each figure, the X direction corresponds to a lateral direction of the cooling device 1, the Y direction corresponds to a longitudinal direction of the cooling device 1, and the Z direction corresponds to a vertical direction and a height direction of the cooling device 1.

The lower case member 32 integrally includes, for example, a bottom wall, four side walls erected from a peripheral edge of the bottom wall, and a joint portion. The upper case member 31 is a plate-shaped member that forms a part of a ceiling wall of the case 3. The ceiling wall of the case 3 covers the electronic component 7, the circuit board 8, the heat conductive portion 5, the shielding portion 6, the graphite sheet 4, and the from the above. The ceiling wall of the case 3 is formed by the upper case member 31 and the heat sink 2. The heat sink 2 fits into an opening formed in the upper case member 31, and is installed flush with the upper case member 31. The heat sink 2 is installed so that heat can be transferred to the upper case member 31. The heat transferred to the upper case member 31 can also be dissipated from the heat sink 2. The upper case member 31 is an external heat dissipater provided so as to dissipate heat to the outside of the cooling device 1. The upper case member 31 and the lower case member 32 are joined to each other by screws or the like to form a box body. Further, the heat sink 2 may also be configured to be thermally separated from the upper case member 31 so as not to transfer heat.

Further, the cooling device 1 may be provided with a connector integrally with, for example, the case 3 or the circuit board 8. The connector contains a connector pin. The connector pin is connected to a circuit pattern or the like of the circuit board 8 having conductivity. Transmission and reception of electric power and control signals between the electric device to which the cooling device 1 is applied and the external device are performed via the connector pins. The circuit board 8 is a printed circuit board on which a circuit pattern is printed, and is fixed to the case 3 in an inside of the case 3.

Figure 4:
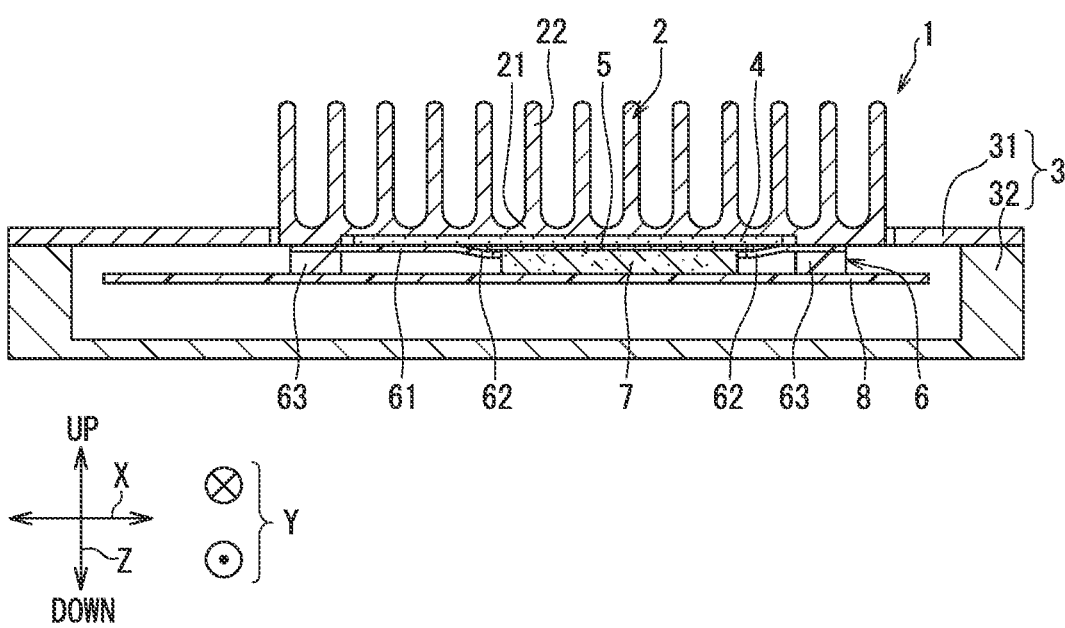
FIG. 4 is a cross-sectional view taken along a line IV-IV in FIG. 3.
Figure 5:
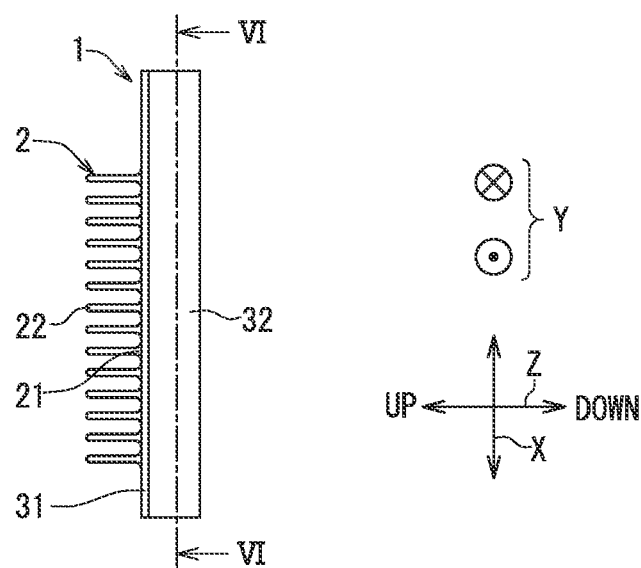
FIG. 5 is a side view of the cooling device.

As shown in FIG. 4, the heat sink 2 includes a flat plate-shaped heat transfer portion 21 and a plurality of fins 22 protruding from the heat transfer portion 21. The fin 22 is a portion in contact with the outside atmosphere. The heat transfer portion 21 is in surface contact with the graphite sheet 4. The graphite sheet 4 is a thin sheet containing graphene. The graphite sheet 4 may be a thin plate of graphite containing a laminate of graphene. The graphite sheet 4 may be in the form of a thin plate containing graphene other than graphite. The graphite sheet 4 is a rectangular thin plate having high thermal conductivity. The graphite sheet 4 is a portion having high thermal diffusivity that can diffuse the transferred heat over a wide range/area.

The heat transfer portion 21, the graphite sheet 4, the heat conductive portion 5, and the electronic component 7 form a laminated body in which they are closely/coherently laminated. The laminated bodies are layered/stacked in the vertical direction. The Z direction in each figure is also a stacking direction. The heat transfer portion 21 is an external heat dissipater that forms a heat path to the fins 22. The heat transfer portion 21 is a section in which the heat generated by the electronic component 7 is transmitted via the graphite sheet 4 and the heat conductive portion 5.

The heat transferred to the heat transfer portion 21 is conducted to the fins 22 and is released from the surface of each fin 22 to the outside atmosphere. As a result, the heat of the electronic component 7 is released to the outside of the cooling device 1, and the electronic component 7 can be cooled. The heat sink 2 is made of a metal material, for example, an aluminum die-cast.

The electronic component 7 is a heat-generating component that generates heat by itself. The electronic component 7 includes, for example, a resistor, a semiconductor chip having a semiconductor integrated circuit, and the like. The electronic component 7 is connected to the circuit board 8 via a bonding member. The electronic component 7 transmits and receives electric power, signals, and the like to and from the circuit board 8.

The heat conductive portion 5 is formed of a material having a higher heat transfer rate than the circuit board 8 and the electronic component 7. The heat conductive portion 5 is formed to have a thickness greater than that of the graphite sheet 4, and has a hardness that the heat conductive portion 5 is deformable by a compressive force acting in a thickness direction. The heat conductive portion 5 is a deformable member/cushioning sandwiched between the electronic component 7 and the graphite sheet 4 to increase the degree of adhesion between the electronic component 7 and the graphite sheet 4. The heat conductive portion 5 is a sheet-like member that is very soft and has high adhesion, and is, for example, a gel, grease, or the like formed in the sheet shape. The heat generated in the electronic component 7 is mainly transferred to the graphite sheet 4 via the heat conductive portion 5, moves from the entire surface of the graphite sheet 4 to the heat transfer portion 21, and is further transferred to the plurality of fins 22.

Figure 6:
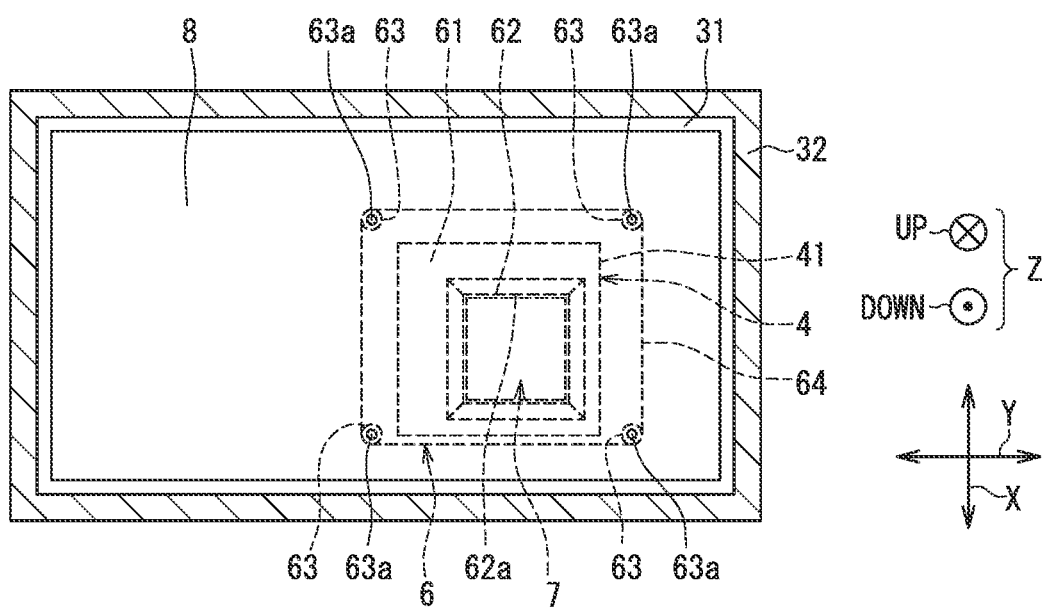
FIG. 6 is a cross-sectional view taken along a line VI-VI of FIG. 5.

The shielding portion 6 covers a part of a lower surface 40 of the graphite sheet 4, which is a surface on a circuit board 8 side not in contact with the heat conductive portion 5. The shielding portion 6 is made of a material having an insulating property. The shielding portion 6 is made of, for example, a resin material. The lower surface 40 of the graphite sheet 4 includes a contact surface 40a in contact with the heat conductive portion 5 and a shielded surface 40b around the contact surface 40a. The lower surface 40 is included in a circuit-board side surface of the graphite sheet 4. The shielded surface 40b is a portion that is not in contact with (i.e., is not covered by) the heat conductive portion 5 and is a portion that overlaps the shielding portion 6 located below in the vertical direction. The shielding portion 6 is provided at a position separated downward from the shielded surface 40b. As shown in FIG. 6, an outer periphery portion 64 of the shielding portion 6 is located outside an outer periphery portion 41 of the graphite sheet 4. The shielding portion 6 covers the entire lower surface 40 of the graphite sheet 4 outside the contact surface 40a.

Figure 7:
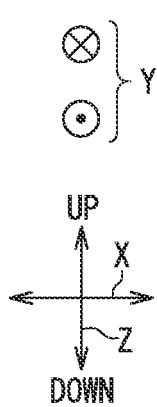
FIG. 7 is a partial cross-sectional view showing a graphite sheet and a shielding portion.
Figure 7:
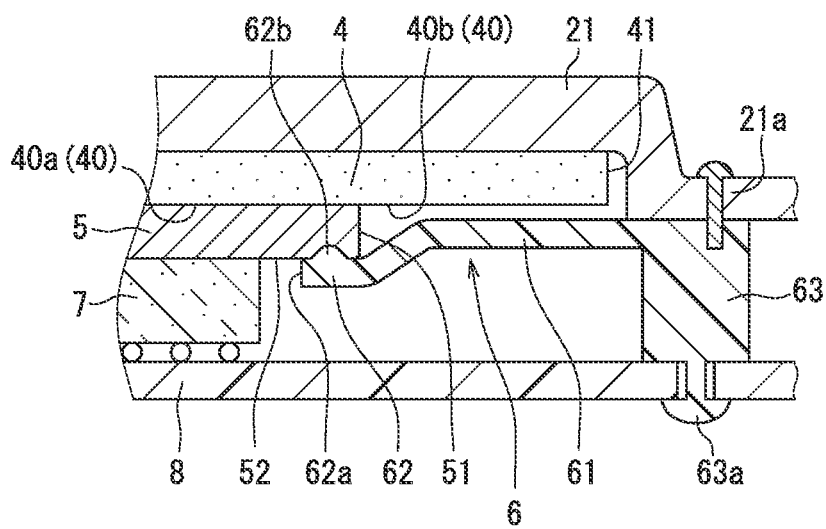

As shown in FIGS. 2 and 7, the shielding portion 6 includes a main part 61 facing and being separate from the shielded surface 40b at a certain distance, and a plurality of leg parts 63. The main part 61 has a flat plate shape having an inner periphery portion 62a forming an opening. The main part 61 is provided along the graphite sheet 4. The main part 61 has a function of receiving a falling object at a position below the graphite sheet 4. The leg part 63 is a part extending downward from the main part 61 and is fixed to the circuit board 8. Therefore, the shielding portion 6 is fixed to the circuit board 8 at multiple positions. As shown in FIG. 6, the inner periphery portion 62a is formed so as to surround an outer periphery portion of the electronic component 7. The inner periphery portion 62a is located inside an outer periphery portion 51 of the heat conductive portion 5, and is provided (i.e., extends) along both the inner periphery portion of the electronic component 7 and the outer periphery portion 51.

The shielding portion 6 has a support portion 62 that supports the lower surface of the heat conductive portion 5 from below. The inner periphery portion 62a is formed on the support portion 62. The support portion 62 is an annular portion that surrounds the opening of the shielding portion 6. The support portion 62 is a portion extending outward from the inner periphery portion 62a to the outer periphery portion 51 of the heat conductive portion 5, and is a portion in contact with the heat conductive portion 5. The support portion 62 is located below the main part 61. The support portion 62 is formed with a protrusion 62b that projects toward the graphite sheet 4. The protrusion 62b bites into the heat conductive portion 5 in the vicinity of the outer periphery portion 51. Therefore, the support portion 62 can reliably grip the heat conductive portion 5, and holds the heat conductive portion 5, the graphite sheet 4, and the heat transfer portion 21 in close contact with each other (i.e., the support portion 62 helps holding the three as one body object).

As shown in FIGS. 6 and 7, an engager 63a that engages with the circuit board 8 is provided at the lower end of the leg part 63. The shielding portion 6 includes a plurality of engagers 63a. The plurality of leg parts 63 project downward from four corners of the outer periphery portion 64 of the shielding portion 6. The engager 63a engages with the circuit board 8 at positions below the four corners. The engager 63a is a part formed by thermally melting and solidifying the lower end portion of the leg part 63. The engager 63a is, in other words, a heat caulking portion formed by applying heat. When the lower end of the leg part 63 is inserted into a through hole of the circuit board 8, a portion protruding from the through hole of the circuit board 8 is thermally melted to form a nail head shape having an outer diameter greater than that of the through hole. By solidifying the nail-head shaped portion, the circuit board 8 can be sandwiched between the nail-head shaped portion and the leg part 63. With a configuration of sandwiching the circuit board 8 in such manner, the shielding portion 6 is integrated with the circuit board 8 to form one body structure.

The shielding portion 6 may have a structure having a fixed portion fixed to the heat sink 2 or to the upper case member 31. The fixed portion is provided on the main part 61. The fixed portion is fixed to the heat sink 2 or to the upper case member 31 by a screw 21a tightening structure or an adhesive structure.

The operation and effect brought about by the cooling device 1 of the first embodiment is described in the following. The cooling device 1 includes a heat-generating component, a circuit board on which the heat-generating component is mounted, an external heat dissipater located above the heat-generating component so as to dissipate heat to the outside, and the graphite sheet 4 integrally provided on the heat-generating component side surface. The cooling device 1 includes the heat conductive portion 5 that contacts both a part of the graphite sheet 4 and the heat-generating component, and the shielding portion 6. The shielding portion 6 covers a surface of the graphite sheet 4 on the circuit board side, being disposed at a position between (i) a portion of the circuit board where no heat-generating component is mounted/disposed and (ii) the graphite sheet 4.

The cooling device 1 constitutes a heat dissipation path through which heat of the heat-generating component is transferred to the external heat dissipater via the heat conductive portion 5 and the graphite sheet 4 for heat dissipation to the outside of the cooling device 1. The graphite sheet 4 is fragile/brittle in strength, and there is a concern that it may be damaged by an external force such as vibration, scattering small pieces of graphene upward/downward. If small pieces adhere to the circuit board, problems such as short circuits may occur. Since the shielding portion 6 of the cooling device 1 is provided so as to cover the surface of the graphite sheet 4 on the circuit board side, a small piece of the graphite sheet 4 can be received/collected. The cooling device 1 can promote heat dissipation of heat-generating components, and can further prevent small pieces of the graphite sheet 4 from adhering to the circuit board.

The shielding portion 6 includes the inner periphery portion 62a formed so as to surround the outer periphery portion of the heat-generating component. According to such configuration, it is possible to provide the shielding portion 6 that covers the surface of the graphite sheet 4 on the circuit board side over the entire circumference of the heat-generating component. As a result, it is possible to prevent small pieces of the graphite sheet 4 from adhering to the entire portion of the circuit board where no heat-generating component is mounted.

The inner periphery portion 62a is formed on (i.e., is formed as a part of) the support portion 62 that supports the lower surface of the heat conductive portion 5 from below. According to such configuration, it is possible to provide the shielding portion 6 that covers the portion of the graphite sheet 4 that is not in contact with the heat conductive portion 5, and it is possible to reliably receive the small pieces separated from the graphite sheet 4. Further, since the support portion 62 pushes the heat conductive portion 5 upward, the degree of adhesion between the heat conductive portion 5 and the graphite sheet 4 and the heat transfer portion 21 is increased, and the thermal resistance between them can be prevented/reduced.

The shielding portion 6 in FIG. 7 has a fixed portion fixed to the circuit board. According to such configuration, since the circuit board and the shielding portion 6 are integrated, the rigidity of the shielding portion 6 is increased, and the position of the shielding portion 6 can be firmly stabilized against, for example, external force, vibration and the like.

The shielding portion 6 has a fixed portion fixed to the external heat dissipater. According to such configuration, since the external heat dissipater and the shielding portion 6 are integrated, the rigidity of the shielding portion 6 is increased, and the position of the shielding portion 6 can be firmly stabilized against, for example, external force, vibration and the like.

The shielding portion 6 is integrally provided in the case 3 that houses the circuit board, the heat-generating component, and the heat conductive portion 5. According to such configuration, since the case 3 and the shielding portion 6 are integrated, the rigidity of the shielding portion 6 is increased, and the position of the shielding portion 6 can be firmly stabilized against, for example, external force, vibration and the like.

Second Embodiment

The second embodiment is described with reference to FIG. 8. The cooling device of the second embodiment is different from the first embodiment in the shielding portion 106. The configurations, operations, and effects that are not particularly described in the second embodiment are the same as those in the first embodiment, and the differences from the first embodiment are described below.

Figure 8:
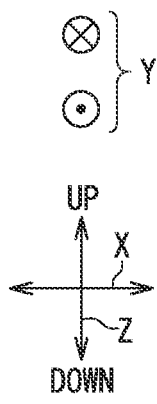
FIG. 8 is a partial cross-sectional view showing the shielding portion of a second embodiment.
Figure 8:
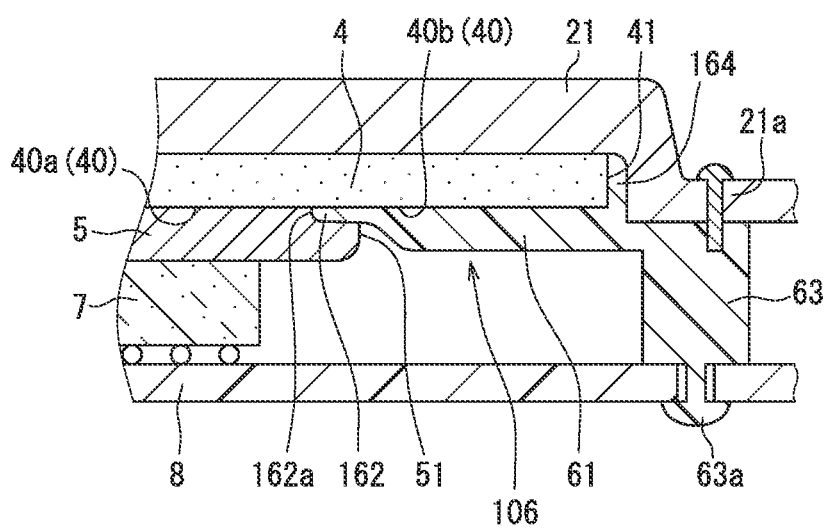

As shown in FIG. 8, the shielding portion 106 includes the main part 61, leg parts 63, and an outer periphery supporter 164 that supports the outer periphery portion 41 of the graphite sheet 4. The main part 61 of the shielding portion 106 has a flat plate shape having an inner periphery portion 162a forming an opening. The outer periphery supporter 164 is a portion extending upward from the main part 61, and is in contact with the outer periphery portion 41 from the outside. The outer periphery supporter 164 may preferably surround an outside of the outer periphery portion 41 on the entire circumference. The outer periphery supporter 164 protects the outer periphery portion 41, which is easily chipped, from peeling off small pieces of the graphite sheet 4.

The inner periphery portion 162a is located inside the outer periphery portion 51 of the heat conductive portion 5, and is configured to be in a position insertably in between the outer periphery portion 51 and the lower surface 40 of the graphite sheet 4. The inner periphery portion 162a is located inside the outer periphery portion 51 on the entire circumference of the outer periphery portion 51, and supports the graphite sheet 4 from below. The inner periphery portion 162a is formed on the support portion 162. The support portion 162 is an annular portion surrounding the opening of the shielding portion 106, and is a portion thinner than the heat conductive portion 5. The shielding portion 106 supports the graphite sheet 4 by contacting thereto at a portion extending outward from the inner periphery portion 162a to the outer periphery portion 41 of the graphite sheet 4. Therefore, the shielding portion 106 can reliably grip/hold the graphite sheet 4 in a wide range/area not in contact with the heat conductive portion 5, and keeps the graphite sheet 4 and the heat transfer portion 21 in close/coherent contact with each other. The shielding portion 106 suppresses the scattering of small pieces of the graphite sheet 4 on both of (a) the surface of the graphite sheet 4 on the circuit board side and (b) the outer periphery portion 41.

Third Embodiment

The third embodiment is described with reference to FIG. 9. The cooling device of the third embodiment is different from the first embodiment in a shielding portion 206. The configurations, operations, and effects that are not particularly described in the third embodiment are the same as those in the first embodiment, and the differences from the first embodiment is described in the following.

Figure 9:
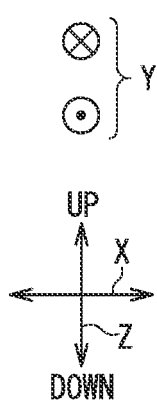
FIG. 9 is a partial cross-sectional view showing the shielding portion of a third embodiment.
Figure 9:
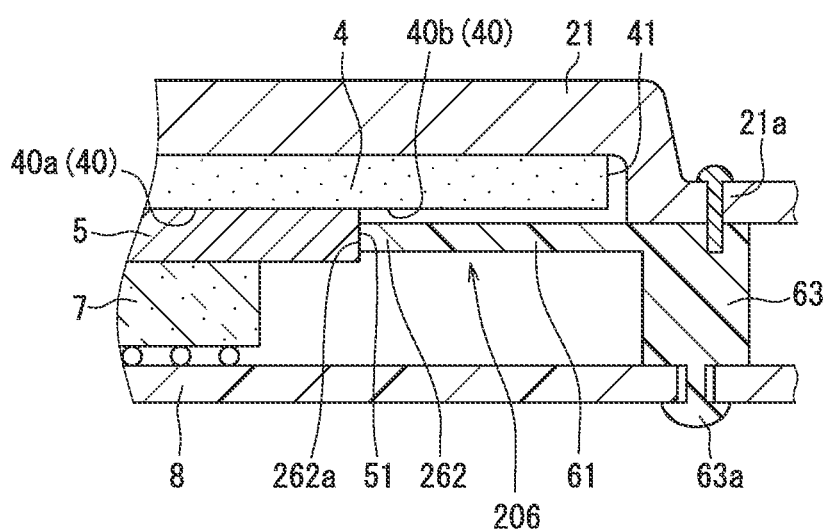

As shown in FIG. 9, the shielding portion 206 includes the main part 61 that faces and is separate from the shielded surface 40b at a distance, a contacting part 262 that contacts the outer periphery portion 51 of the heat conductive portion 5, and a plurality of leg parts 63. An inner periphery portion 262a forms an opening provided in the shielding portion 206. The inner periphery portion 262a is formed to surround the outer periphery portion 51 of the heat conductive portion 5. The inner periphery portion 262a is in contact with the outer periphery portion 51. The main part 61 of the shielding portion 206 covers the surface of a part of the graphite sheet 4 that is not in contact with the heat conductive portion 5. By having the shielding portion 206, the circuit-board-side surface of the graphite sheet 4 can be covered over a wide range radially extending from the entire outer circumference of the heat conductive portion 5.

The contacting part 262 is an edge portion on an inner periphery portion 262a side of the main part 61. The contacting part 262 is an annular portion that surrounds the opening of the shielding portion 206. By having the contacting part 262, a gap between the heat conductive portion 5 and the shielding portion 206 is closed. By having such shielding portion 206, the small pieces of the graphite sheet 4 can be received by the shielding portion 206 without letting them to adhering to the circuit board. Further, according to the shielding portion 206, since the heat conductive portion 5 comes into contact with the outer periphery portion 51, the heat conductive portion 5 can be reduced in size.

Fourth Embodiment

The fourth embodiment is described with reference to FIG. 10. The fourth embodiment is different from the above-described embodiments in the configuration related to a shielding portion 306 and the configuration including a coated portion 42. The configurations, operations, and effects not particularly described in the fourth embodiment are the same as those in the above-described embodiments, and the differences from the above-described embodiments are described in the following.

Figure 10:
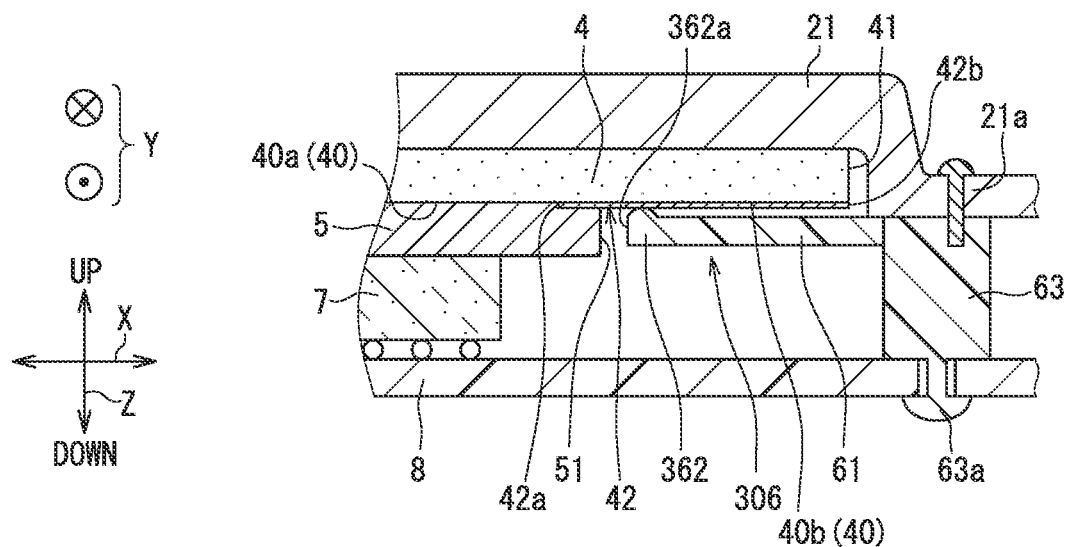
FIG. 10 is a partial cross-sectional view showing the shielding portion of a fourth embodiment.

As shown in FIG. 10, the coated portion 42 covers at least a part of the lower surface 40 of the graphite sheet 4 that is not in contact with the heat conductive portion 5. The coated portion 42 covers the shielded surface 40b. Since the coated portion 42 is provided to cover the circuit-board-side surface of the graphite sheet 4, it is possible to prevent small pieces of the graphite sheet 4 from falling onto the circuit board.

The coated portion 42 is provided so that the inner periphery portion 42a is located inside the outer periphery portion 51 of the heat conductive portion 5. An inner periphery portion 42a side part of the coated portion 42 is interposed at a position between the graphite sheet 4 and the heat conductive portion 5. The coated portion 42 is provided so that an outer periphery portion 42b covers the outer periphery portion 41 of the graphite sheet 4.

The coated portion 42 is a thin layer formed of a material such as a thin metal or resin. The coated portion 42 may be made of polyethylene, polyvinyl, or rubber. The coated portion 42 may be configured by attaching a sheet-like body to the lower surface 40 of the graphite sheet 4. The coated portion 42 may be formed by applying/painting the above-mentioned material and solidifying it. Since the coated portion 42 is in the form of a thin sheet, it can be made thinner as a component, which contributes to suppressing the manufacturing cost.

The shielding portion 306 includes the main part 61 that faces the coated portion 42 and is separated from the coated portion 42, and a support portion 362. The main part 61 and the leg part 63 are separate members that are joined together, or have a configuration that is integrally formed by two-color molding. The main part 61 has a flat plate shape having an inner periphery portion 362a forming an opening. The shielding portion 306 is fixed to the circuit board 8 at a plurality of positions. The support portion 362 comes into contact with the lower surface of the coated portion 42 and supports the integral body of the coated portion 42 and the graphite sheet 4 from below. The inner periphery portion 362a is formed as a part of the support portion 362. The inner periphery portion 362a is formed so as to surround the outer periphery portion 51 of the heat conductive portion 5. The inner periphery portion 362a is located outside the outer periphery portion 51 of the heat conductive portion 5. Alternatively, the inner periphery portion 362a may be configured to be in contact with the outer periphery portion 51 of the heat conductive portion 5.

The shielding portion 306 of the fourth embodiment is provided at a position between a portion of the circuit board where no heat-generating component is mounted and the circuit-board-side surface of the coated portion 42. According to such configuration, even if the graphite sheet 4 in a portion reinforced by the coated portion 42 is chipped, the small pieces can be received by the shielding portion 306.

Fifth Embodiment

The fifth embodiment is described with reference to FIG. 11. The fifth embodiment differs from the fourth embodiment in the configuration relating to a shielding portion 406. The configurations, operations, and effects not particularly described in the fifth embodiment are the same as those in the above-described embodiment(s), and the differences from the above-described embodiment(s) are described below.

Figure 11:
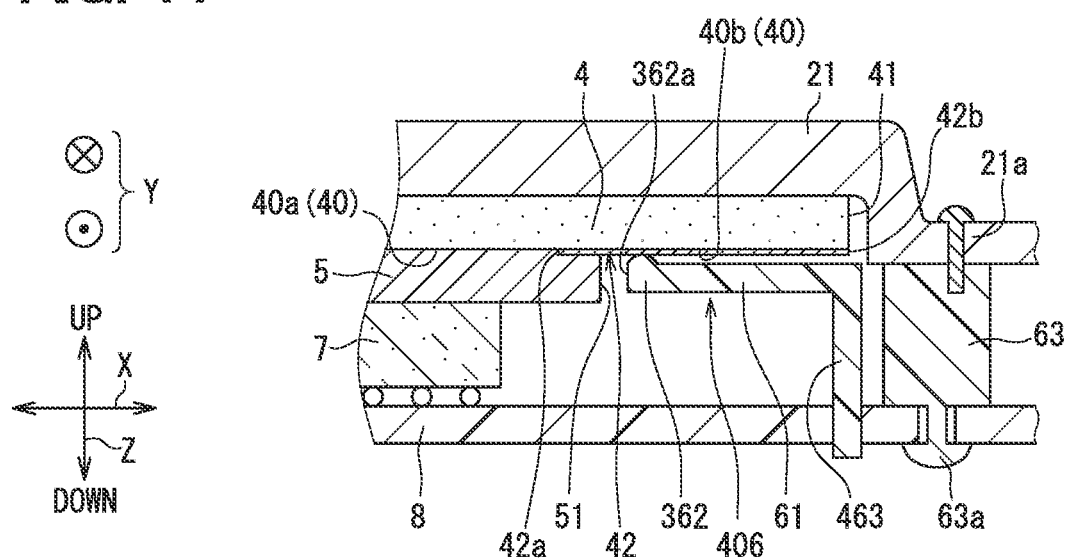
FIG. 11 is a partial cross-sectional view showing the shielding portion of a fifth embodiment.

As shown in FIG. 11, the shielding portion 406 is a member separate from the leg part 63. The shielding portion 406 includes a fixed portion 463 fixed to the circuit board 8. The fixed portion 463 is a wall-shaped portion extending downward from the main part 61. The fixed portion 463 has, formed thereon, a welded portion whose end portion is welded to the circuit board 8 and fixed, for example.

Sixth Embodiment

The sixth embodiment is described with reference to FIGS. 12 to 18. In the cooling device of the sixth embodiment, a shielding portion 506 and an upper case member 131 are different from those of the first embodiment. The configurations, operations, and effects not particularly described in the sixth embodiment are the same as those in the first embodiment, and the differences from the first embodiment are described below.

Figure 12:
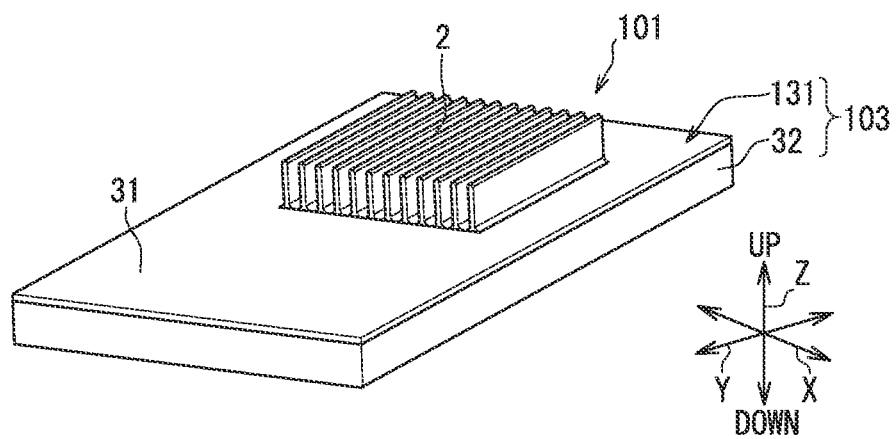
FIG. 12 is a perspective view showing a cooling device according to a sixth embodiment.
Figure 13:
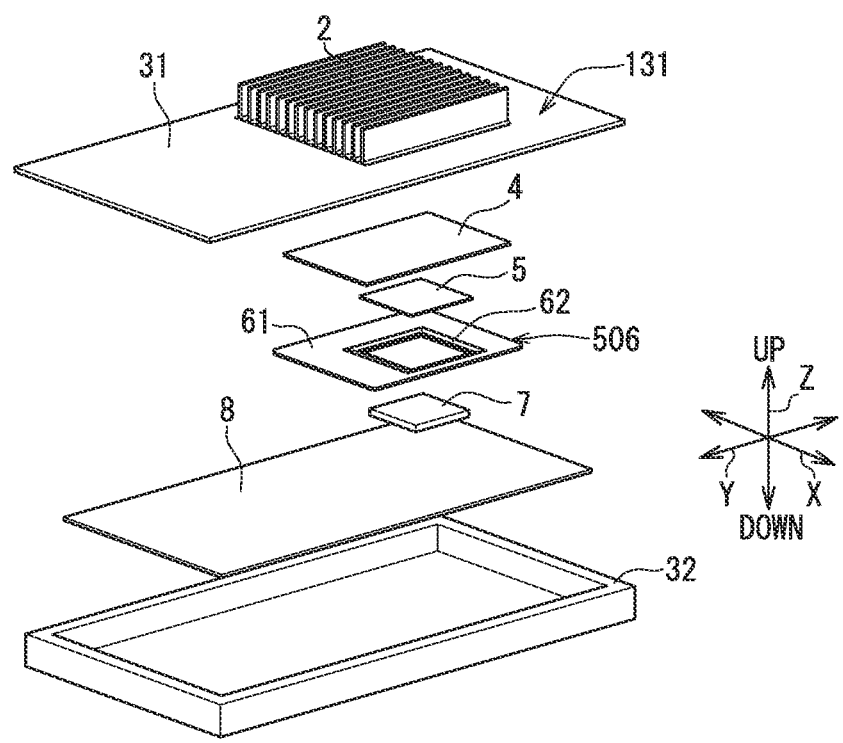
FIG. 13 is another exploded view of the cooling device.
Figure 14:
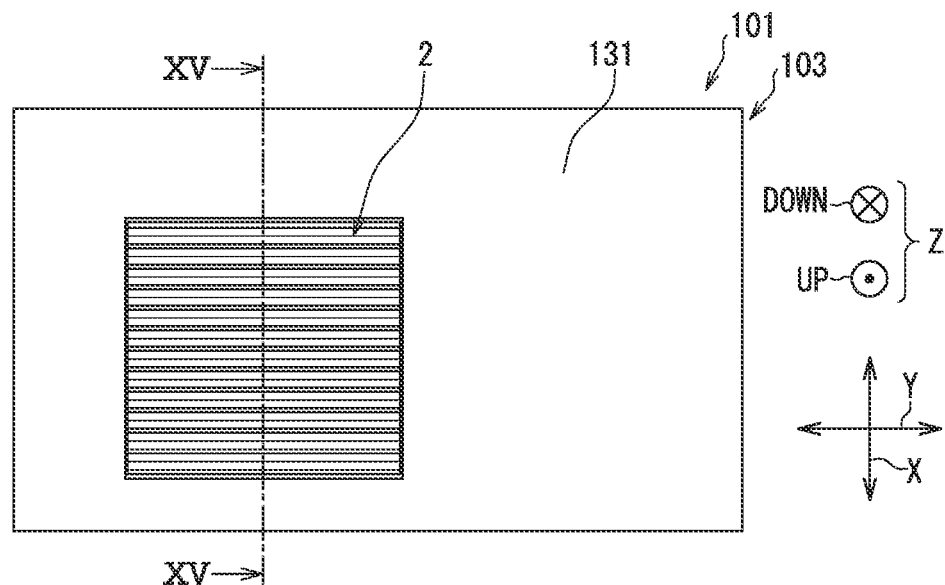
FIG. 14 is a plan view of the cooling device as viewed downward from a top.

As shown in FIG. 12, the upper case member 131 is formed by integrally forming a plate-shaped member forming a part of the ceiling wall of a case 103 and the heat sink 2 as one component. The upper case member 131 covers the electronic component 7, the circuit board 8, the heat conductive portion 5, the shielding portion 506, the graphite sheet 4, and the like upward.

Figure 17:
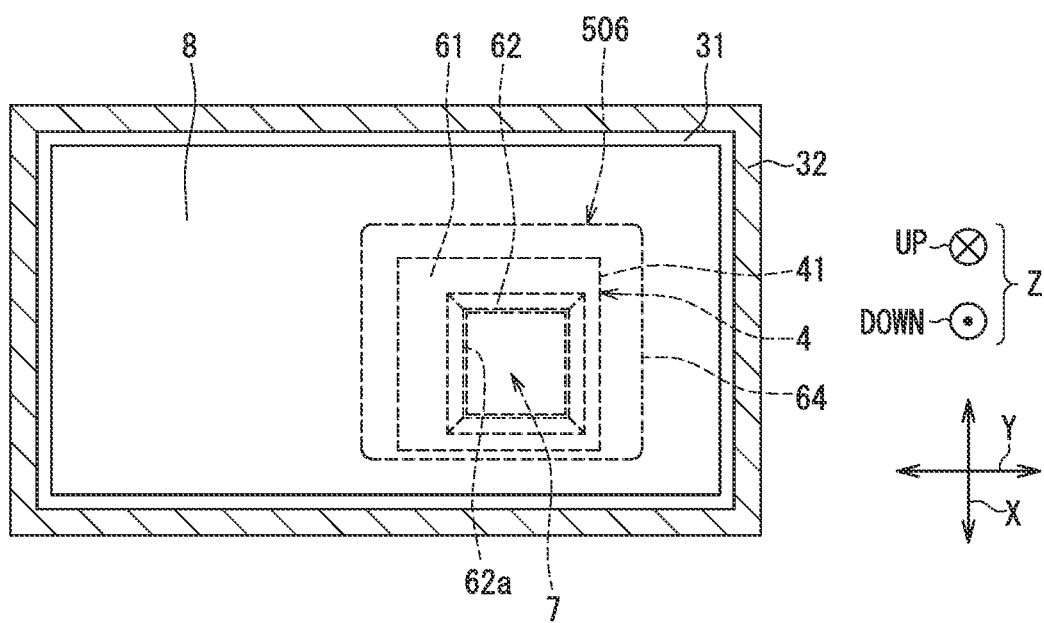
FIG. 17 is a cross-sectional view taken along a line XVII-XVII of FIG. 16.

The shielding portion 506 is made of the same material as the shielding portion 6. The shielding portion 506 is provided to cover the shielded surface 40b of the graphite sheet 4. The main part 61 of the shield 506 is in contact with the shielded surface 40b. Further, the shielding portion 506 may be provided at a position separated below from the shielded surface 40b. As shown in FIG. 17, the outer periphery portion 64 of the shielding portion 506 is located outside the outer periphery portion 41 of the graphite sheet 4. The shielding portion 506 covers the entire range of the circuit-board-side surface of the graphite sheet 4, which is outside the contact surface 40a.

The shielding portion 506 may have a configuration having a fixed portion 61a fixed to the heat sink 2 or the upper case member 131. The fixed portion 61a may be fixed to the heat sink 2 or the upper case member 131, for example, by a coupling structure using a fixing tool such as a screw 12 or an adhesive structure. The shielding portion 506 has the fixed portion 61a fixed to the external heat dissipater.

Figure 15:
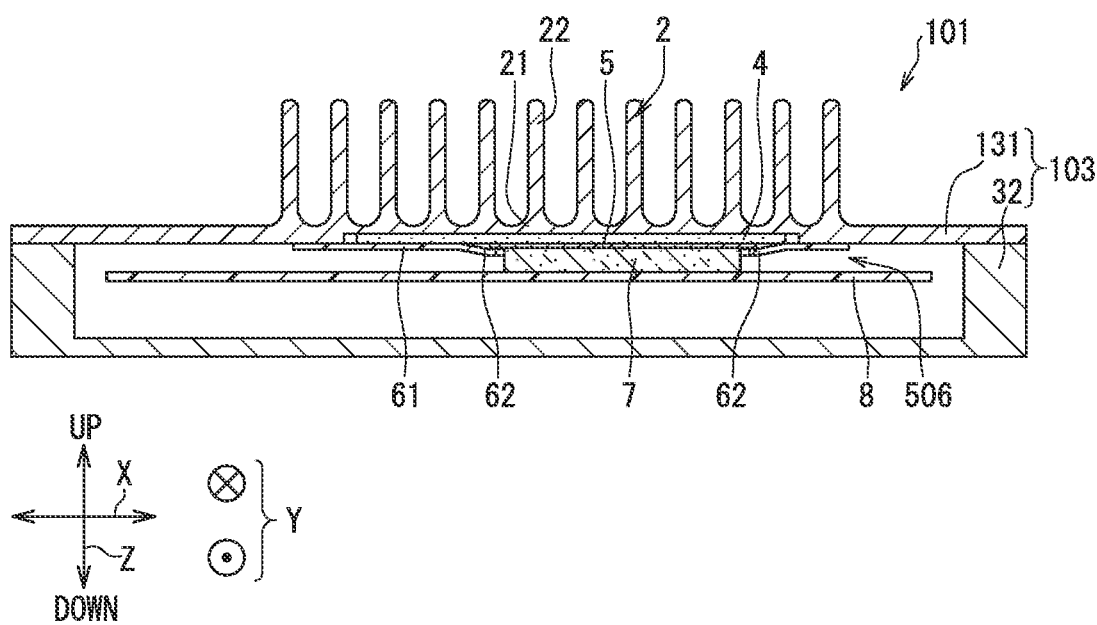
FIG. 15 is a cross-sectional view taken along a line XV-XV of FIG. 14.
Figure 16:
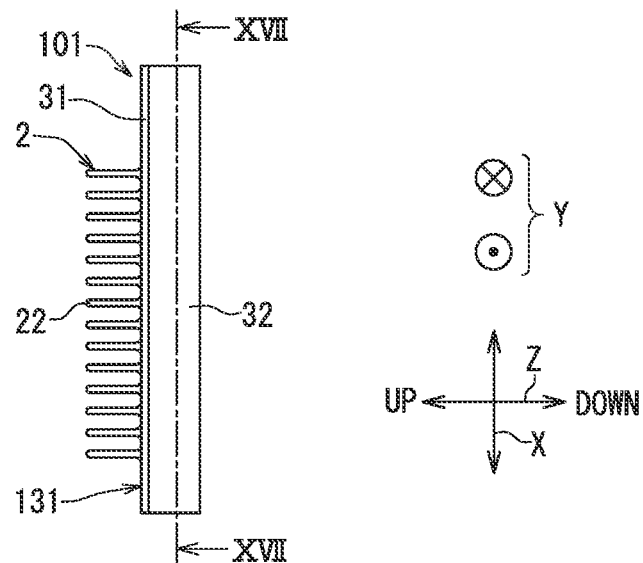
FIG. 16 is a side view of the cooling device.
Figure 18:
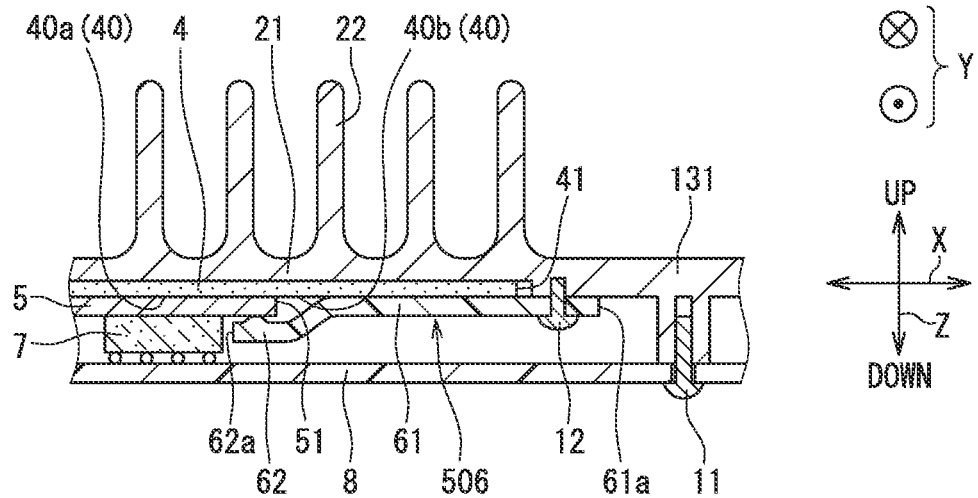
FIG. 18 is a partial cross-sectional view showing the graphite sheet and the shielding portion.

As shown in FIGS. 15 and 18, the shielding portion 506 includes the main part 61 and the support portion 62 that supports the lower surface of the heat conductive portion 5 from below. The support portion 62 of the shielding portion 506 is the same as the support portion 62 of the first embodiment in terms of configurations, functions, operations and effects, and the like. The positional relationship between the inner periphery portion 62a, the outer periphery portion of the electronic component 7, and the outer periphery portion 51 of the heat conductive portion 5 is the same as that in the first embodiment. The main part 61 of the shielding portion 506 has a function of receiving a falling object at a position below the graphite sheet 4 and has a function of protecting the graphite sheet 4 by having a surface contact with the graphite sheet 4.

The circuit board 8 is fixed to the case 103 or to the upper case member 131 at a plurality of positions. According to such configuration, the circuit board 8, the electronic component 7, the heat conductive portion 5, the graphite sheet 4, the case 103, and the like can be integrated into one structure. The circuit board 8 is connected to the case 103 by, for example, a fixture of a screw 11 screwed into a boss portion provided on the case 103.

The operations and effects brought about by the cooling device 101 of the sixth embodiment are described in the following. The shielding portion 506 is integrally provided with the case 103. According to such configuration, since the case 103 and the shielding portion 506 are integrated, the rigidity of the shielding portion 506 is increased, and the position of the shielding portion 506 can be stabilized against external force, vibration, or the like. Further, it is possible to construct/provide a heat path for dissipating the heat transferred to the shielding portion 506 from the surface of the case 103 to the outside.

The shielding portion 506 has the fixed portion 61a fixed to the external heat dissipater. According to such configuration, since the external heat dissipater and the shielding portion 506 are integrated, the rigidity of the shielding portion 506 is increased, and the position of the shielding portion 506 can be stabilized against external force, vibration, or the like. Further, it is possible to construct/provide a heat path for dissipating the heat transferred to the shielding portion 506 from the external heat dissipater to the outside.

Seventh Embodiment

The seventh embodiment is described with reference to FIG. 19. The cooling device of the seventh embodiment is different from the sixth embodiment in a shielding portion 606. The configurations, operations, and effects that are not particularly described in the seventh embodiment are the same as those in the sixth embodiment, and the differences from the sixth embodiment are described below.

Figure 19:
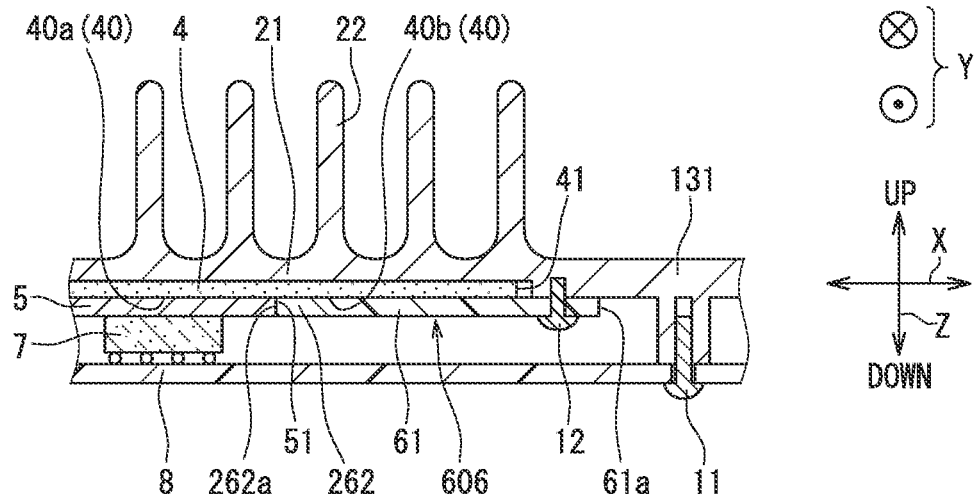
FIG. 19 is a partial cross-sectional view showing the shielding portion of a seventh embodiment.

As shown in FIG. 19, the shielding portion 606 includes the contacting part 262 that contacts the outer periphery portion 51 of the heat conductive portion 5. The inner periphery portion 262a forms an opening provided in the shielding portion 606. The inner periphery portion 262a surrounds the outer periphery portion 51 of the heat conductive portion 5. The inner periphery portion 262a of the shielding portion 606 is in contact with the outer periphery portion 51. According to the shielding portion 606, the circuit-board-side surface of the graphite sheet 4 can be covered over a wide range radially extending from the entire outer circumference of the heat conductive portion 5.

The contacting part 262 is an annular portion that surrounds the opening of the shielding portion 606. According to the contacting part 262, the gap between the heat conductive portion 5 and the shielding portion 606 is covered/closed. According to the shielding portion 606, the small pieces of the graphite sheet 4 can be received by the shielding portion 606 without letting them adhering to the circuit board. Further, according to the shielding portion 606, since it comes into contact with the outer periphery portion 51 of the heat conductive portion 5, the heat conductive portion 5 can be miniaturized.

Eighth Embodiment

The eighth embodiment is described with reference to FIG. 20. The eighth embodiment is different from the above-described embodiment in the configuration related to a shielding portion 706. The configurations, operations, and effects not particularly described in the eighth embodiment are the same as those in the above-described embodiment, and the differences from the above-described embodiment are described below.

Figure 20:
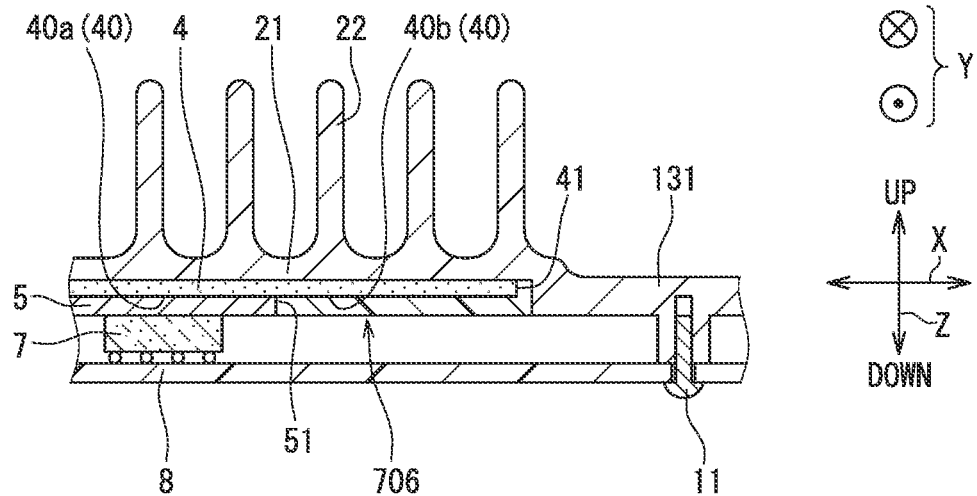
FIG. 20 is a partial cross-sectional view showing the shielding portion of an eighth embodiment.

As shown in FIG. 20, the shielding portion 706 is a potting portion provided to fill/cover the circuit-board-side surface of the graphite sheet 4 extending outwardly from a periphery of the heat conductive portion 5 and a circumjacent or adjoining area of the heat conductive portion 5. The potting portion covers at least the portion of the lower surface 40 of the graphite sheet 4 that is not in contact with the heat conductive portion 5. The shielding portion 706 is a potting portion provided to fill/cover the lower surface 40 of the graphite sheet 4 on the circuit board side extending outwardly from the periphery of the heat conductive portion 5 and the circumjacent or adjoining area of the heat conductive portion 5. The potting portion protects the circuit-board-side surface of the graphite sheet 4 so that small pieces of the graphite sheet 4 that are easily chipped do not come off and fall. Since the potting portion is provided to cover the circuit-board-side surface of the graphite sheet 4, it is possible to prevent small pieces of the graphite sheet 4 from adhering to the circuit board.

The potting portion seals the shielded surface 40*b* of the graphite sheet 4 and the outer periphery portion 41 with resin with respect to, i.e., from, the circuit board 8. The resin to be sealed is made of a thermosetting resin such as an epoxy resin. The sealing resin is filled so that the shielded surface 40*b* and the outer periphery portion 41 are filled. The potting portion provides the shielding portion 706 capable of sealing the shielded surface 40*b* from the outside by resin sealing.

Ninth Embodiment

The ninth embodiment is described with reference to FIG. 21. The ninth embodiment differs from the above-described embodiment in the configuration related to a shielding portion 806. The configurations, operations, and effects not particularly described in the ninth embodiment are the same as those in the above-described embodiment, and the differences from the above-described embodiment are described below.

Figure 21:
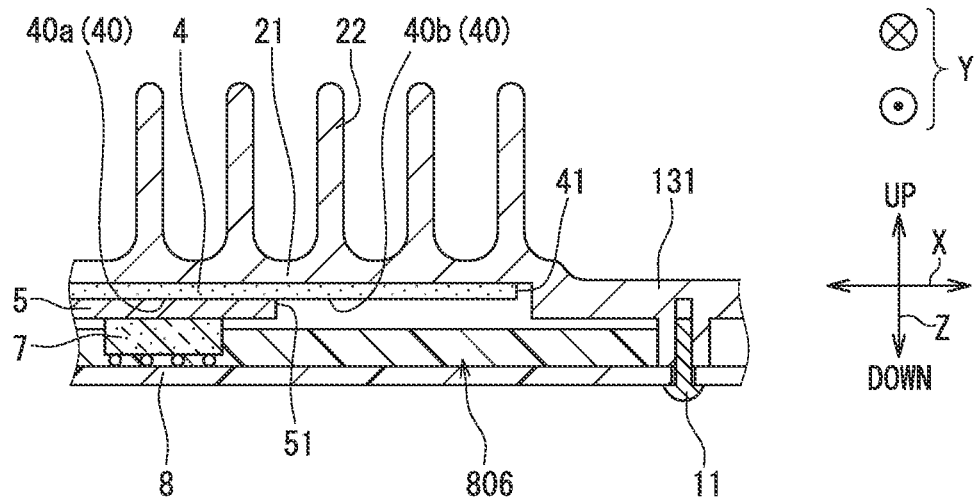
FIG. 21 is a partial cross-sectional view showing the shielding portion of a ninth embodiment.

As shown in FIG. 21, the shielding portion 806 is a potting portion provided on the circuit board 8 so as to fill a portion of the circuit board 8 where no electronic component 7 is mounted. The shielding portion 806 seals the upper surface of the circuit board 8 with a resin. The shielding portion 806 covers at least a portion of the graphite sheet 4 on the circuit board side that is not in contact with the heat conductive portion 5. The shielding portion 806 is a potting portion provided to cover the lower surface 40 of the graphite sheet 4 on the circuit board side and to fill/cover/seal the circuit board. The shielding portion 806 protects the upper surface of the circuit board so that a small piece of the graphite sheet 4 peeled off therefrom does not come into contact with the conductive portion of the circuit board. The shielding portion 802 is formed of the same resin material as the shielding portion 706 of the eighth embodiment. Since the potting portion can seal the circuit board 8 from the outside by resin sealing, the shielding portion 806 having high reliability against dropping and/or floating of the small pieces is devisable.

Tenth Embodiment

The tenth embodiment is described with reference to FIG. 22. The tenth embodiment is different from the above-described embodiment in that it includes a coated portion 142 that covers the lower surface of the graphite sheet 4. The configurations, operations, and effects not particularly described in the tenth embodiment are the same as those in the above-described embodiment, and the differences from the above-described embodiment are described below.

Figure 22:
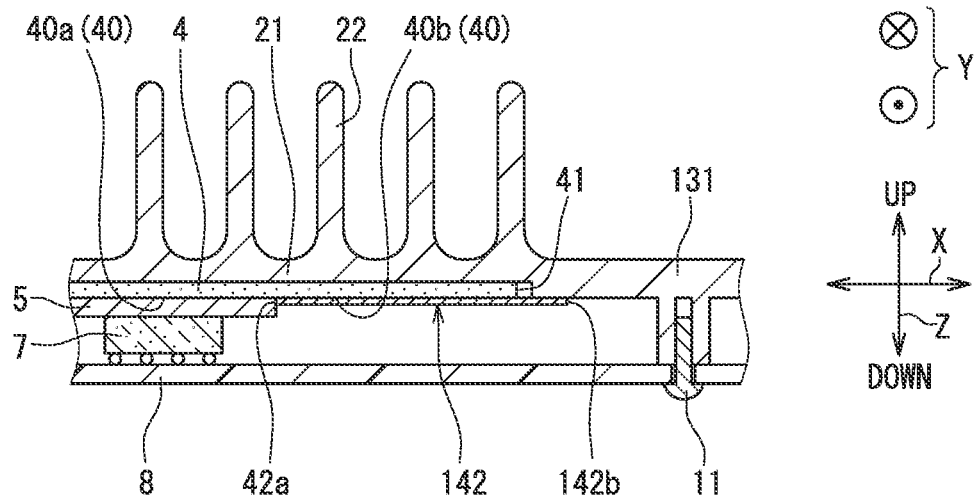
FIG. 22 is a partial cross-sectional view showing the shielding portion of a tenth embodiment.

As shown in FIG. 22, the coated portion 142 covers at least a portion of the graphite sheet 4 on the circuit board side that is not in contact with the heat conductive portion 5. The coated portion 142 covers the shielded surface 40*b*. Since the coated portion 142 is provided to cover the circuit board side surface of the graphite sheet 4, it is possible to prevent small pieces of the graphite sheet 4 from adhering to the circuit board.

The coated portion 142 is provided so that the inner periphery portion 42*a* surrounds the outer periphery portion 51 of the heat conductive portion 5. An outer periphery portion 142*b* of the coated portion 142 is located outside the outer periphery portion 41 of the graphite sheet 4, and the coated portion 142 covers the outer periphery portion 41. The coated portion 142 is in contact with the upper case member 131 on the outside of the outer periphery portion 41. The coated portion 142 may be adhered to the upper case member 131. According to such configuration, the coated portion 142 is integrally provided on the graphite sheet 4 and the upper case member 131.

The coated portion 142 is a thin layer formed of a material such as metal or resin. The coated portion 142 may be made of polyethylene, polyvinyl, or rubber. The coated portion 142 may be configured by attaching a sheet-like body to the lower surface 40 of the graphite sheet 4. The coated portion 142 may be formed by applying/painting the above-mentioned material and solidifying it. Since the coated portion 142 is in the form of a thin sheet, it can be made thinner as a component, which contributes to reducing the manufacturing cost. Further, the coated portion 142 may also be configured to cover the contact surface 40*a* in contact with the heat conductive portion 5 on the lower surface 40 of the graphite sheet 4.

Eleventh Embodiment

The eleventh embodiment is described with reference to FIG. 23. The cooling device of the eleventh embodiment is different from the seventh embodiment in a shielding portion 906. The configurations, operations, and effects not particularly described in the eleventh embodiment are the same as those in the seventh embodiment, and the differences from the seventh embodiment are described below.

Figure 23:
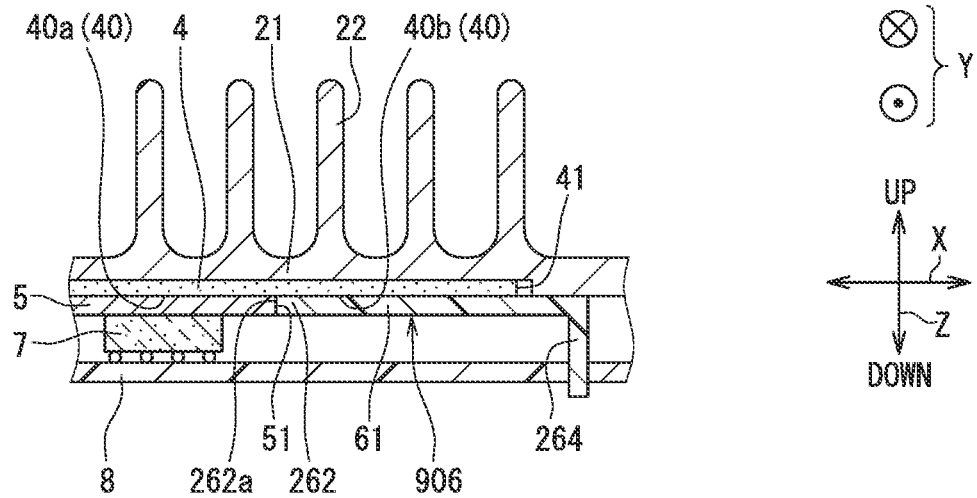
FIG. 23 is a partial cross-sectional view showing the shielding portion of an eleventh embodiment.

As shown in FIG. 23, the shielding portion 906 includes a fixed portion 264 fixed to the circuit board 8. The fixed portion 264 is a wall-shaped portion extending downward from the main part 61. The fixed portion 264 is formed with, for example, a welded portion whose end portion is welded to the circuit board 8 and fixed.

The shielding portion 906 has the fixed portion 264 fixed to the circuit board. According to such configuration, since the circuit board and the shielding portion 906 are integrated, the rigidity of the shielding portion 906 is increased, and the position of the shielding portion 906 can be stabilized against external force, vibration, or the like.

Twelfth Embodiment

Figure 24:
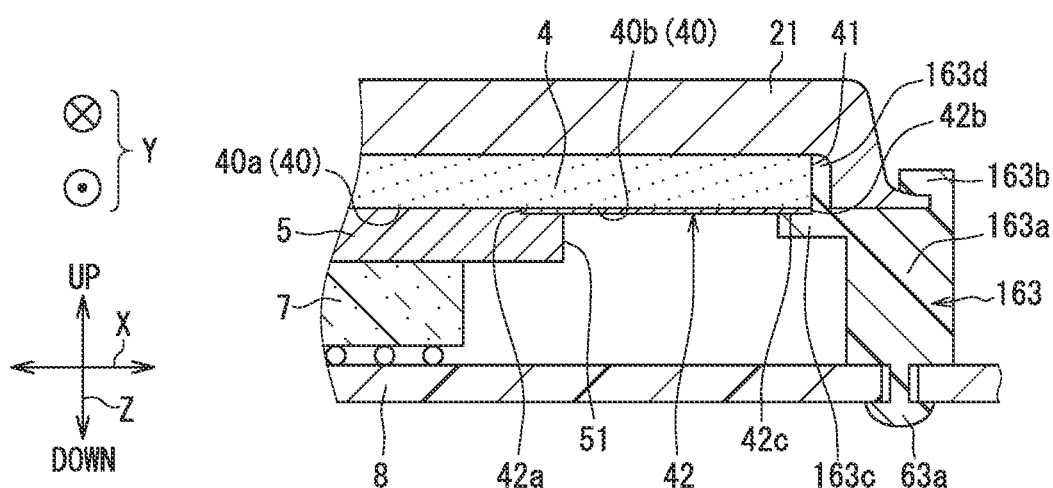
FIG. 24 is a partial cross-sectional view showing the shielding portion of a twelfth embodiment.
Figure 25:
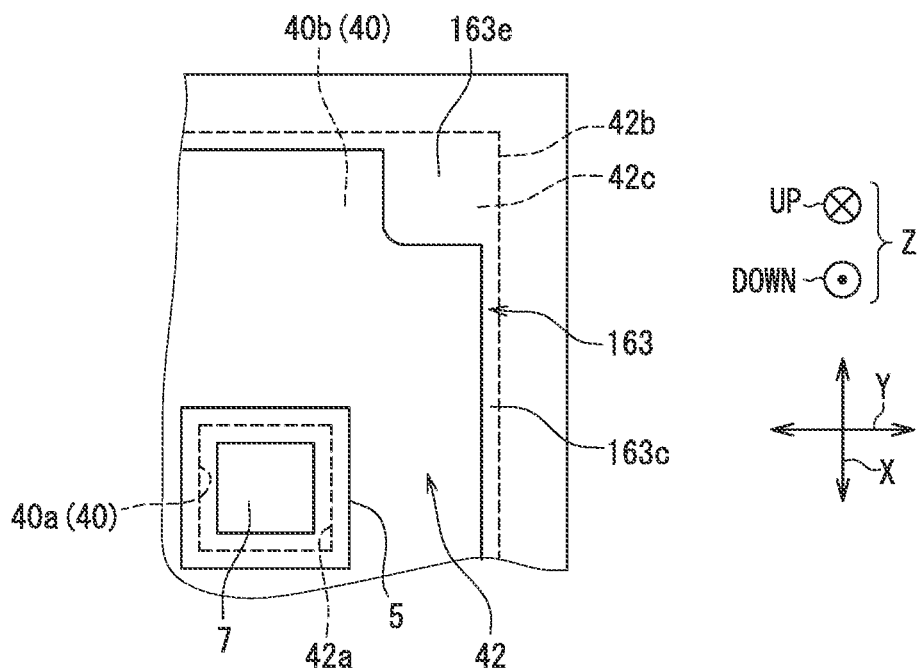
FIG. 25 is a partial plan view of the shielding portion viewed upward from a bottom.

The twelfth embodiment is described with reference to FIGS. 24 and 25. The cooling device of the twelfth embodiment is different from the first embodiment in that the coated portion 42 is provided and the shielding portion 906 is provided. The configurations, operations, and effects that are not particularly described in the twelfth embodiment are the same as those in the first embodiment, and the differences from the first embodiment are described below.

The coated portion 42 is the same as the coated portion 42 of the fourth embodiment, and the description in the fourth embodiment is incorporated. As shown in FIGS. 24 and 25, the shielding portion 906 includes an annular protective portion 163c, a plurality of leg portions 163, a coupling portion 163b, and an outer periphery support portion 163d that supports the outer periphery portion 41 of the graphite sheet 4. The leg portion 163 has the engager 63a that engages with the circuit board 8 at the lower portion of the leg portion 163. As the configuration and the method of forming the engager 63a, the description of the first embodiment is incorporated.

The annular protective portion 163c is an annular portion that covers, from below, (a) the outer periphery portion 42b and (b) an annular lower surface 42c of the coated portion 42 in the vicinity of the outer periphery portion thereof. The annular protective portion 163c may be configured to be separated from the lower surface 42c in the vicinity of the outer periphery portion of the coated portion 42. The annular protective portion 163c is preferably in contact with the lower surface 42c of the coated portion 42. As shown in FIG. 25, the annular protective portion 163c includes a corner protection portion 163e that covers the corner portion of the outer periphery portion 42b of the coated portion 42 from below.

The corner protection portion 163e may be configured to be separated from the lower surface 42c of the coated portion 42, but is preferably configured to be in contact with the lower surface 42c. The corner protection portion 163e is formed to have a longer length dimension from the outer periphery portion 42b than the portion of the annular protective portion 163c excluding the corner protection portion 163e. The dimension from the outer periphery portion 42b shown by the broken line in FIG. 25 to the inner periphery portion of the corner protection portion 163e is longer than the dimension from the outer periphery portion 42b to the inner periphery portion of the annular protective portion 163c.

The outer periphery support portion 163d is a portion extending upward from the annular protective portion 163c and is in contact with the outer periphery portion 41 from the outside. The outer periphery support portion 163d preferably surrounds, from the outside, the entire circumference of the outer periphery portion 41. The outer periphery support portion 163d protects the outer periphery portion 41, which is easily chipped, from peeling off small pieces of the graphite sheet 4.

The coupling portion 163b is a portion that couples the heat transfer portion 21 or the case 3 and the shielding portion 906. The coupling portion 163b is a portion that holds a part of the heat transfer portion 21 or a part of the case 3 to sandwich it from above and below.

The operations and effects brought about by the cooling device of the twelfth embodiment are described below. The shielding portion 906 is provided to cover the outer periphery portion 42b of the coated portion 42. According to such configuration, the coated portion 42 reinforces the graphite sheet 4 and suppresses the graphite sheet 4 from peeling off. On the other hand, the outer periphery portion 42b is a portion of the coated portion 42 that is easily damaged by external force, vibration, or the like. Since the shielding portion 906 covers the outer periphery portion 42b, even if the coated portion 42 or the graphite sheet 4 is peeled off at/around the outer periphery portion 42b, it is possible to prevent small pieces from adhering to the circuit board.

The shielding portion 906 is an annular protective portion that is in contact with at least a corner portion of the outer periphery portion 42b of the coated portion 42 from below. The corner portion of the outer periphery portion 42b is a portion that is easily damaged by external force, vibration, or the like. Since the shielding portion 906 contacts the corner portion from below, the corner portion can be protected and the coated portion 42 and the graphite sheet 4 can be prevented from peeling off at the corner portion.

The shielding portion 906 is an annular protective portion that contacts the outer periphery portion 42b of the coated portion 42 and the surface of the coated portion 42 on the circuit board side in the vicinity of the outer periphery portion 42b. According to such configuration, since the annular protective portion comes into contact with the outer periphery portion 42b and the surface on the circuit board side, peeling of the coated portion 42 and the graphite sheet 4 in the vicinity of the inner periphery portion can be prevented.

Thirteenth Embodiment

The thirteenth embodiment is described with reference to FIG. 26. The cooling device of the thirteenth embodiment is different from the twelfth embodiment in that it includes a net-like portion 9 that functions as a shielding portion. The configurations, operations, and effects not particularly described in the thirteenth embodiment are the same as those in the twelfth embodiment, and the differences from the twelfth embodiment are described below.

Figure 26:
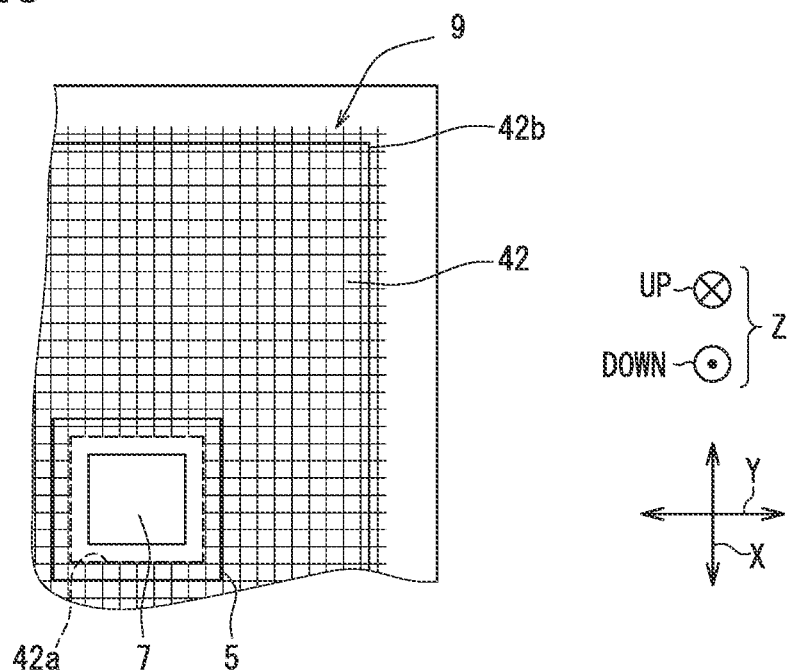
FIG. 26 is a partial plan view of the shielding portion viewed upward from a bottom in a thirteenth embodiment.

As shown in FIG. 26, the net-like portion 9 is provided to cover the circuit-board-side surface of the coated portion 42. The net-like portion 9 is, for example, a grid-like, mesh-like, punch-hole-like net. The size of the opening in the net-like portion 9 is set to be smaller than, for example, a small piece of the coated portion 42 that can be peeled off by an external force, vibration and the like. Since the coated portion 42 has a higher strength than the graphite sheet 4, the chip/debris that can be peeled off by an external force or vibration becomes large. Therefore, the net-like portion 9 can function as a shielding portion.

The shielding portion of the thirteenth embodiment is the net-like portion 9 provided to cover the circuit-board-side surface of the coated portion 42. According to such configuration, the net-like portion 9 can receive the small pieces separated from the graphite sheet 4. The cooling device of the thirteenth embodiment can promote heat dissipation of the heat-generating component, and can further prevent small pieces of the graphite sheet 4 from adhering to the circuit board.

Other Embodiments

The present disclosure is not restricted to the embodiments shown as examples. The present disclosure encompasses the illustrated embodiments and variations thereof by those skilled in the art. For example, the present disclosure is not limited to the combinations of components and elements shown in the embodiments, and various modifications and implementations can further be performed. The present disclosure may be implemented in various combinations. The present disclosure may have additional portions that may be added to the embodiments. The present disclosure encompasses the omission of parts and elements of the embodiments. The present disclosure encompasses the replacement or combination of components, elements between one embodiment and the other. The disclosed technical scope is not limited to the description of the embodiments. It should be understood that the disclosed technical scope is defined in claims and includes meanings equivalent to the claims and all modifications in the scope of the claims.

In the above-described embodiment, the cooling device may be installed upside down so that the heat sink portion is located below. In such case, the shielding portion has a function of receiving the small pieces at a position above the graphite sheet 4. The cooling device that can achieve the object described in the specification includes a configuration in which the cooling device described in each figure is installed upside down.

In the above-described embodiment, the main part 61 and the leg part 63 included in one component may be separate components and may be integrally formed by adhesion, welding, or the like. Further, the main part 61 and the leg part 63 may be integrally formed by two-color molding or the like.

What is claimed is:

1. A cooling device comprising:
a heat-generating component;
a circuit board on which the heat-generating component is mounted;
an external heat dissipater provided to dissipate heat to outside of the cooling device;
a graphite sheet containing graphene, which is integrally provided on a first surface of the external heat dissipater, the first surface being opposed to the heat-generating component;
a heat conductive portion contacting both a part of the graphite sheet and the heat-generating component and having thermal conductivity capable of transferring heat from the heat-generating component to the graphite sheet; and
a shielding portion provided at a position between a portion of the circuit board where no heat-generating component is mounted and the graphite sheet to cover a shielded surface of the graphite sheet on a circuit board side thereof
wherein
the shielding portion includes an inner periphery portion located inside an outer periphery portion of the heat conductive portion and insertably in between the heat conductive portion and the graphite sheet.

2. The cooling device of claim 1, wherein
the shielding portion includes an inner periphery portion formed to surround an outer periphery portion of the heat-generating component.

3. The cooling device of claim 2, wherein
the inner periphery portion is formed as a part of a support portion that supports a lower surface of the heat conductive portion from below.

4. The cooling device of claim 1, wherein
the shielding portion includes an inner periphery portion that is formed to surround the outer periphery portion of the heat conductive portion.

5. The cooling device of claim 4, wherein
the inner periphery portion is in contact with the outer periphery portion, and covers a surface of a portion of the graphite sheet that is not in contact with the heat conductive portion.

6. The cooling device of claim 1 further comprising:
a coated portion that covers at least a part of a circuit-board-side surface of the graphite sheet that is not in contact with the heat conductive portion, wherein
the shielding portion is provided to cover an outer periphery portion of the coated portion.

7. The cooling device of claim 1 further comprising:
a coated portion that covers at least a part of a circuit-board-side surface of the graphite sheet that is not in contact with the heat conductive portion, wherein
the shielding portion is an annular protective portion that contacts at least a corner portion of an outer periphery portion of the coated portion.

8. The cooling device of claim 1, further comprising:
a coated portion that covers at least a part of a circuit-board-side surface of the graphite sheet that is not in contact with the heat conductive portion, wherein
the shielding portion is an annular protective portion that contacts (i) an outer periphery portion of the coated portion and (ii) a circuit-board-side surface of the coated portion in a vicinity of the outer periphery portion.

9. The cooling device of claim 1, further comprising:
a coated portion that covers at least a part of a circuit-board-side surface of the graphite sheet that is not in contact with the heat conductive portion, wherein
the shielding portion is a net-like portion provided to cover a circuit-board-side surface of the coated portion.

10. The cooling device of claim 1, further comprising:
a coated portion that covers at least a part of a circuit-board-side surface of the graphite sheet that is not in contact with the heat conductive portion, wherein
the shielding portion is provided at a position between a portion of the circuit board where no heat-generating component is mounted and a circuit-board-side surface of the coated portion.

11. The cooling device of claim 1, wherein
the shielding portion has a fixed portion fixed to the circuit board.

12. The cooling device of claim 1, wherein
the shielding portion has a fixed portion fixed to the external heat dissipater.

13. The cooling device of claim 1 further comprising:
a case for housing the circuit board, the heat-generating component, and the heat conductive portion, wherein
the shielding portion is integrally provided in the case.

14. The cooling device of claim 1, wherein
the shielding portion is a potting portion provided to fill a space between a circuit-board-side surface of the graphite sheet and an adjoining area of the heat conductive portion.

15. The cooling device of claim 1, wherein
the shielding portion is a potting portion provided to cover a circuit-board-side surface of the graphite sheet and to fill space above the circuit board.

16. The cooling device of claim 1, wherein the heat-generating component, the heat conductive portion, the graphite sheet, and the external heat dissipater are stacked in this order and are in surface contact with each other.

17. The cooling device of claim 16, wherein the external heat dissipater includes a heat transfer portion and a fin, the heat transfer portion is flat plate-shaped and has the one side and an other side, which is opposite to the one side, the one side is in surface contact with the graphite sheet, and the fin protrudes from the other side of the heat transfer portion.

18. A cooling device comprising:

a circuit board;

an electric component mounted on top of the circuit board, wherein the electric component is configured to generate heat during use;

a heat conductor contacting an upper surface of the electric component and extending horizontally beyond a perimeter of the upper surface of the electric component;

a graphite sheet contacting an upper surface of the heat conductor and extending horizontally beyond a perimeter of the upper surface of the heat conductor;

a heat sink including a heat transfer portion, wherein the heat transfer portion: (i) contacts an upper surface of the graphite sheet, (ii) extends horizontally beyond a perimeter of the upper surface of the graphite sheet, and (iii) extends a flange downward to surround an outer periphery portion of the graphite sheet;

a shielding portion including: (i) a support portion, and (ii) a main part, wherein the shielding portion is configured to prevent particles from the graphite sheet from falling downward onto the circuit board, the shielding portion includes an inner periphery portion located inside an outer periphery portion of the heat conductor and insertably in between the heat conductor and the graphite sheet.

19. The cooling device of claim 18, wherein the support portion of the shielding portion extends under the outer peripheral portion of the heat conductor, and is configured to push the heat conductor upwardly against the graphite sheet.

20. The cooling device of claim 18, wherein the shielding portion further includes an outer periphery supporter extending upward from the main part and located between the outer periphery portion of the graphite sheet and an inner portion of the flange, and wherein the support portion extends above the outer periphery portion of the heat conductor, such that the outer periphery portion of the heat conductor upwardly presses the support portion against the graphite sheet.

21. The cooling device of claim 18, wherein the electric component, the heat conductor, the graphite sheet, and the heat sink are stacked in this order and are in surface contact with each other.

22. The cooling device of claim 21, wherein the heat transfer portion is flat plate-shaped and has one side and an other side, which is opposite to the one side, the one side is in surface contact with the graphite sheet, and the heat sink includes a fin that protrudes from the other side of the heat transfer portion.

* * * * *

UNITED STATES PATENT AND TRADEMARK OFFICE
CERTIFICATE OF CORRECTION

| | |
|---|---|
| PATENT NO. | : 11,805,593 B2 |
| APPLICATION NO. | : 17/331700 |
| DATED | : October 31, 2023 |
| INVENTOR(S) | : Yoshirou Baba |

It is certified that error appears in the above-identified patent and that said Letters Patent is hereby corrected as shown below:

In the Claims

Column 18, Line 11 (Claim 19):
Change the recitation of "outer peripheral portion" to "outer periphery portion"

Signed and Sealed this
Twelfth Day of December, 2023

Katherine Kelly Vidal
*Director of the United States Patent and Trademark Office*